United States Patent [19]
Pascucci et al.

[11] Patent Number: 5,559,743
[45] Date of Patent: Sep. 24, 1996

[54] REDUNDANCY CIRCUITRY LAYOUT FOR A SEMICONDUCTOR MEMORY DEVICE

[75] Inventors: Luigi Pascucci, Sesto S. Giovanni; Marcello Carrera, Trescore Balneario; Marco Defendi, Sulbiate, all of Italy

[73] Assignee: SGS-Thomson Microelectronics S.r.l., Agrate Brianza, Italy

[21] Appl. No.: 412,550

[22] Filed: Mar. 29, 1995

[30] Foreign Application Priority Data

Mar. 29, 1994 [EP] European Pat. Off. .............. 94830146

[51] Int. Cl.⁶ ..................................................... G11C 7/00
[52] U.S. Cl. ............................ 365/200; 365/63; 371/10.2
[58] Field of Search ................................ 365/200, 51, 63; 371/10.2, 10.3

[56] References Cited

U.S. PATENT DOCUMENTS

| | | | |
|---|---|---|---|
| 4,811,306 | 3/1989 | Böning et al. ............................ | 365/200 |
| 5,231,604 | 7/1993 | Watanabe ............................ | 365/189.05 |
| 5,255,227 | 10/1993 | Haeffele ................................ | 365/200 |
| 5,459,690 | 10/1995 | Rieger et al. ............................ | 365/200 |

FOREIGN PATENT DOCUMENTS

| | | |
|---|---|---|
| 0559368 | 9/1993 | European Pat. Off. . |
| 2229021 | 9/1990 | United Kingdom . |

*Primary Examiner*—Son Dinh
*Attorney, Agent, or Firm*—David V. Carlson; Seed and Berry LLP; Bryan A. Santarelli

[57] ABSTRACT

Redundancy circuitry layout for a semiconductor memory device comprises an array of programmable non-volatile memory elements for storing the addresses of defective bit lines and word lines which must be functionally replaced respectively by redundancy bit lines and word lines. The redundancy circuitry layout is divided into identical layout strips which are perpendicular to the array of memory elements and which each comprise first and a second strip sides located at opposite sides of the array of memory elements, the first strip side containing at least one programmable non-volatile memory register of a first plurality for the selection or redundancy bit lines and being crossed by a column address signal bus running parallel to the array or memory elements, the second strip side containing one programmable non-volatile memory register of a second plurality for the selection or redundancy word lines and being crossed by a row address signal bus running parallel to the array of memory elements.

19 Claims, 8 Drawing Sheets

REDUNDANCY CIRCUITRY LAYOUT FOR A SEMICONDUCTOR MEMORY DEVICE

TECHNICAL FIELD

The present invention relates to a redundancy circuitry layout for a semiconductor memory device.

BACKGROUND OF THE INVENTION

Semiconductor memory devices are generally organized in a bidimensional array memory matrix) wherein the single memory elements are located at the intersection or rows ("word lines") and columns ("bit lines") of the matrix. To access a given memory element, it is necessary to select the word line and the bit line at the intersection of which said memory element is located; to this purpose, the memory address bus is divided into row and column address signals, which are decoded independently.

It is known that in the manufacture of semiconductor memories defects are frequently encountered that afflict a limited number of memory elements in the memory matrix. The reason for the high probability or detects of this type is that, in a semiconductor memory device, the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective memory elements, from many millions of memory elements, threes the rejection of the entire chip, and therefore to increase the manufacturing process yield, the technique is known of providing for the manufacture of a certain number or additional memory elements, commonly called "redundancy memory elements," to be used as a replacement of those elements that, during testing or the memory device, prove defective. The selection circuits, with which the integrated component must necessarily be provided, and which allow the above-mentioned functional replacement of a defective memory element with a redundancy memory element, are indicated as a whole with the name of "redundancy circuitry," while the set or redundancy memory elements and circuitry is defined in short as "redundancy."

The redundancy circuitry comprises programmable non-volatile memory registers (redundancy registers) suitable to store those address configurations corresponding to the defective memory elements. Such registers are programmed once and for all during the memory device testing, and must retain the information stored therein even in absence of the power supply.

In practical implementations of redundancy in memory devices, both word lines and bit lines of redundancy memory elements are generally provided in the memory matrix. Each redundancy word line or bit line is associated with a respective row or column redundancy register wherein the address of a defective word line or bit line is stored so that, whenever the defective word line or bit line is addressed, the corresponding redundancy word line or bit line is selected.

The adoption of redundancy in semiconductor memory devices is profitable from the point of view of the increase in the manufacturing process yield only if the increase in the overall chip size is not very high, so that, once the statistical defectiveness of the process is taken into account, the number of "good" memory device chips per wafer is, on average, higher than that obtainable without implementing redundancy. To limit the chip area necessary for implementing redundancy, a careful evaluation of how many redundancy word lines and bit lines are to be provided in the memory matrix is essential, as well as an optimized design of the physical layout of the redundancy circuitry.

SUMMARY OF THE INVENTION

In view of the state of the art described, the objective of the present invention is to provide a redundancy circuitry layout which minimizes the chip size overhead due to the implementation of redundancy.

According to the present invention, such objective is attained by means of a redundancy circuitry layout for a semiconductor memory, device, the redundancy circuitry comprising a first plurality of programmable non-volatile memory registers for the selection of redundancy bit lines of redundancy memory elements, and a second plurality of programmable non-volatile memory registers for the selection or redundancy word lines of redundancy memory elements. One preferred embodiment of the present invention comprises an array of programmable non-volatile memory elements for storing the addresses of defective bit lines and word lines which must be functionally replaced respectively by redundancy bit lines and word lines, and in that it is divided into identical layout strips which are perpendicular to said array of memory elements and which each comprise first and second strip sides located at opposite sides of the array of memory elements, the first strip side containing at least one memory register of the first plurality, and being crossed by a column address signal bus running parallel to the array of memory elements, the second strip side containing one memory register of the second plurality and being crossed by a row address signal bus running parallel to the array of memory elements.

Thanks to the present invention, and particularly to the fact that circuit blocks interacting both with each other and with the same signals have been physically grouped in a same chip region, the redundancy circuitry is very compact, and the increase in the overall chip size is therefore limited.

DETAILED DESCRIPTION OF THE INVENTION

Figure 6:
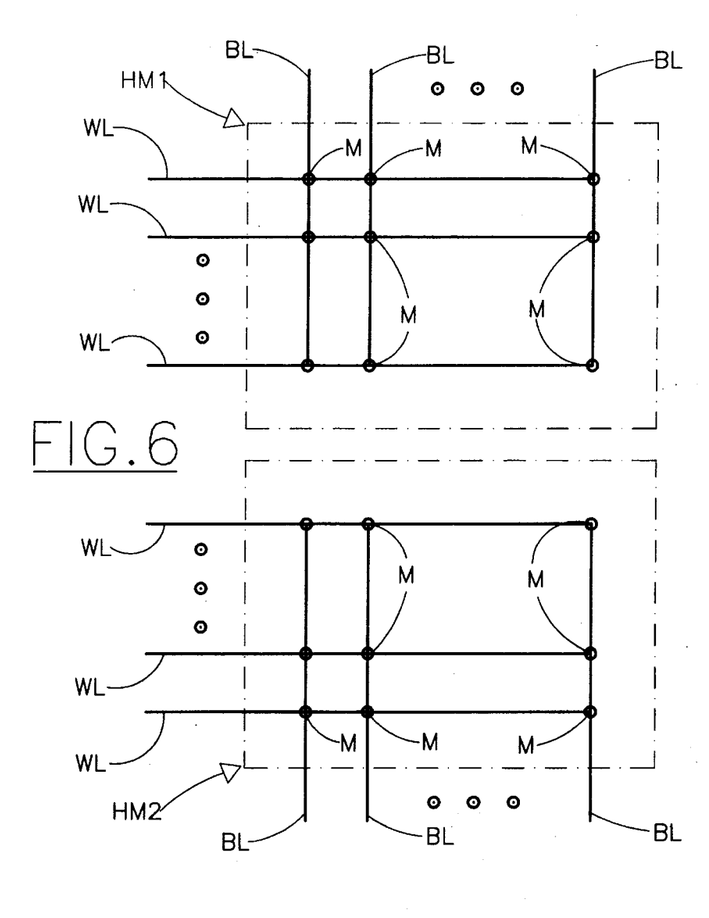
FIG. 6 is a schematic view of a memory, matrix architecture for a semiconductor memory device.

In the following, a redundancy circuitry for a semiconductor memory device will be described initially from the circuit point of view, and successively from the physical layout point of view. The redundancy circuitry will, by way of example, be thought to be integrated in a word-organized Flash EEPROM device (i.e., with sixteen bits in the external input/output data bus), wherein the memory elements (represented by stacked-gate MOS transistors) are located at the intersection of rows (word lines WL) and columns (bit lines BL) of either one or another of two bidimensional arrays or half-matrices HM1, HM2 (FIG. 6). With respect to an architecture providing for only one bidimensional array of memory elements, the shown architecture allows limiting the word line and bit line length, thus reducing, as known to anyone skilled in the art, the memory device access time. Furthermore, as is typical in Flash EEPROM devices, individually-addressable memory, sectors are provided (e.g., four sectors), each ideally divided into sector portions representing the sector memory space dedicated to respective bits in the memory device external input/output data bus. A sector portion can be imagined as being made up of a respective group of bit lines; for example, in the case of a word-organized memory device, each one of the four memory sectors comprises sixteen sector portions or bit line groups.

The memory device is provided with both word lines and bit lines of redundancy memory elements, which in the following will be referred to as "redundancy word lines" and "redundancy bit lines," respectively. Accordingly, the redundancy circuitry comprises a row redundancy circuitry and a column redundancy circuitry. Furthermore, each memory sector is provided with dedicated redundancy bit lines, e.g., four redundancy bit lines per sector. A defective bit line in a given memory sector can be replaced only by one of the four redundancy bit lines associated with such sector.

A column redundancy circuitry for a word-organized sectored memory device is described in the copending European Patent Application No. 94830061.1, filed Feb. 17, 1994, incorporated herein by reference and comprises a plurality of programmable non-volatile memory registers (column redundancy registers), each one associated with a respective redundancy bit line and each one suitable to store an address of a defective bit line which must be replaced by the associated redundancy bit line. In the present example, four column redundancy registers per memory sector are necessary, for a total of sixteen column redundancy registers.

Figure 7:
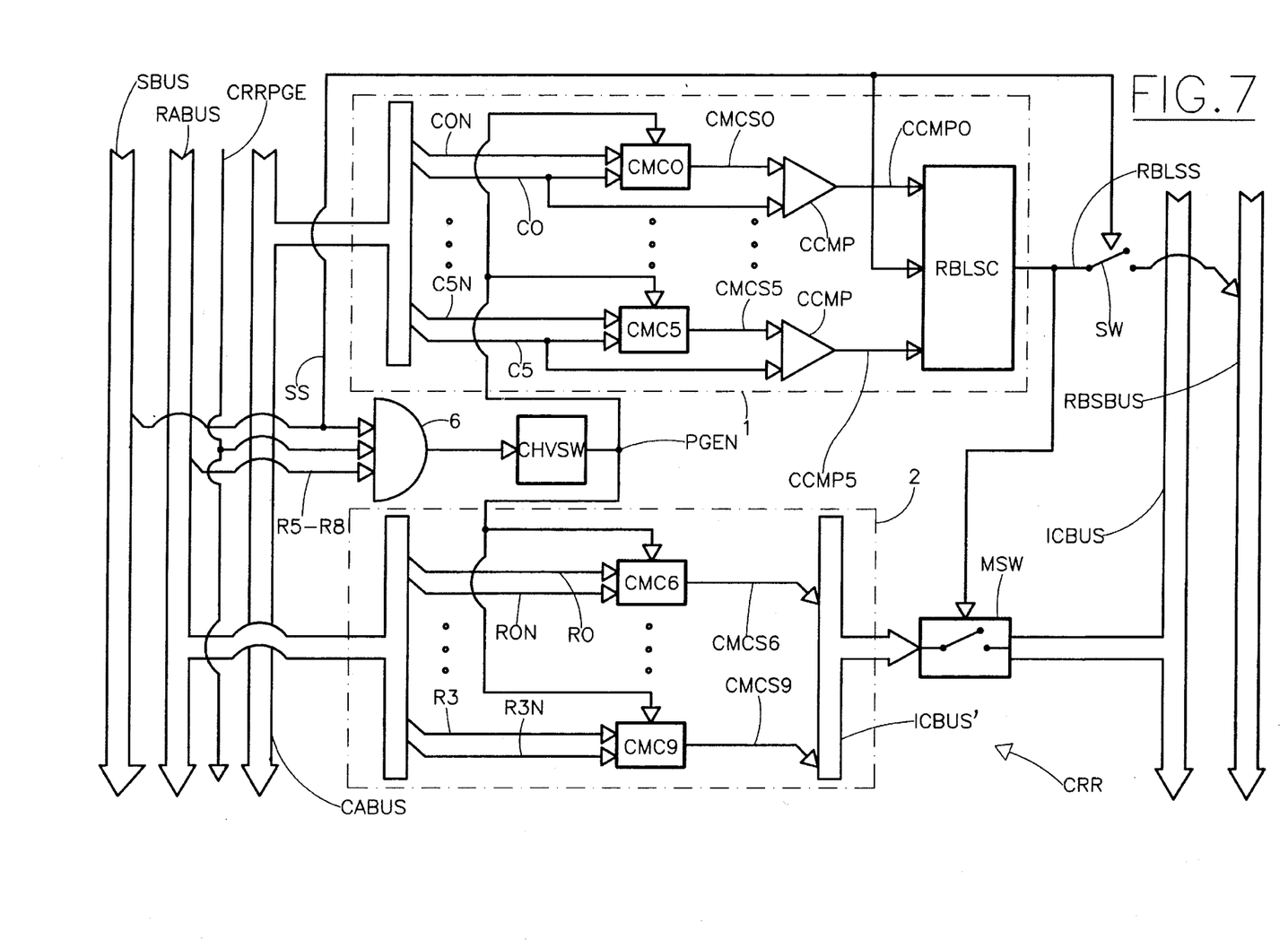
FIG. 7 is a schematic circuit diagram of a non-volatile memory register of the first plurality of the redundancy circuitry, for the selection of redundancy bit lines.

With reference to FIG. 7, each column redundancy register CRR of the circuitry, according to the present invention is substantially made up of a first part, represented in FIG. 7 by a block 1, wherein the address of a defective bit line can be stored by programming the memory cells of the redundancy register, and of a second pan, represented in FIG. 7 by a block 2, suitable to store, in a coded form, information suitable to determine in which sector portion of a given memory sector (i.e., in which of the sixteen groups of bit lines constituting the memory sector) the defective bit line whose address is stored in block 1 has been found.

Block 1 comprises a number of programmable non-volatile memory cells CMC0–CMC5 equal to the number of column address signals C0–C5 which, together with their respective logic-complemented signals C0N–C5N, constitute a column address signal bus CABUS also supplying, in a per-se known way, a column decoding circuitry (not shown) for addressing (i.e., selecting) single bit lines of a given memory sector. Each memory cell CMC0–CMC5 is supplied, for programming purposes, with a respective column address signal C0–C5 and with the respective complemented signal C0N–C5N. Each memory cell CMC0–CMC5 has an output signal CMCS0–CMCS5 representing the memory cell status, which is supplied, together with the respective column address signal C0–C5, to a respective comparator CCMP whose output signal CCMP0–CCMP5 is activated only when the memory cell stored data, represented by the signal CMCS0–CMCS5, coincides with the current state of the respective column address signal C0–C5. All the signals CCMP0–CCMP5 supply a redundancy bit line selection circuit RBLSC which is also supplied with a memory sector selection signal SS taken from a sector selection signal bus SBUS. The bus SBUS is, in the present example, made up of four sector selection signals, each one allowing the selection, for reading or programming, of one respective memory sector. The four column redundancy registers CRR associated with each memory sector are commonly supplied with one of the four sector selection signals of the bus SBUS. Referring again to FIG. 7, when all the signals CCMP0–CCMP5 and the sector selection signal SS are activated (i.e., when the current state of the column address signals C0–C5 coincides with the logic state stored in the memory cells CMC0–CMCS, which means that a defective column address is supplied to the memory device, and the currently addressed memory sector is that to which the redundancy bit line associated with the column redundancy register CRR belongs), the redundancy bit line selection circuit RBLSC activates a respective redundancy bit line selection signal RBLSS. Said signal RBLSS is connected through a respective switch SW controlled by the sector selection signal SS, to one of four signals of a bus RBSBUS which runs from the redundancy circuitry to redundancy bit lines selection means (not shown). Each signal of the bus RBSBUS is associated with four redundancy bit lines, each of which is associated with a different memory sector, and to four column redundancy registers CRR, each one associated with a different memory sector. The switches SW in each one of said four column redundancy registers perform a multiplexing action so that, when a given memory sector is addressed, the four signals of the bus RBSBUS are electrically connected to the signals RBLSS of the four column redundancy registers CRR associated with said addressed sector. In this way, with a bus RBSBUS of just four signals common to all the sixteen column redundancy registers, it is possible to individually select sixteen redundancy bit lines.

Block 2 in each column redundancy register CRR comprises a number of memory cells CMC6–CMC9 sufficient to store, in coded form, an identifying code for identifying the memory sector portion wherein the defective bit line whose address is stored in the memory cells CMC0–CMC5 of the block 1 has been found. In the example shown, referring to a word-organized memory device with sixteen bits in the external input/output data bus, a four-bit code is sufficient to identify the sixteen different memory sector portions of each memory sector. Each memory cell CMC6–CMC9 is supplied, for programming purposes, with a respective row address signal R0–R3 and with the respective complemented signal R0N–R3N, taken from a row address signal bus RABUS also supplying, in a per-se known way, a row decoding circuitry (not shown) for addressing (i.e., selecting) single word lines inside each one of the two memory halt-matrices HM1,HM2 of FIG. 6. The memory cell stored data output signals CMCS6–CMCS9 are grouped together in a local identifying code bus ICBUS'. The local identifying code bus ICBUS' is connected to a common identifying code bus ICBUS through a respective multiple switch MSW (a switch with four input channels and four output channels) controlled by the redundancy bit line selection signal RBLSS. The common identifying code bus ICBUS is made up of four signals and is common to all the sixteen column redundancy registers CRR. The multiple switches MSW in each column redundancy register CRR perform a multiplexing action, so that at any time the signals of the bus ICBUS are electrically connected to the signals of the local bus ICBUS' of the column redundancy register CRR which is associated with the currently addressed memory sector and which stores the address of the currently addressed defective bit line. If the currently addressed bit line in the currently addressed memory sector is not defective, all the switches MSW are open, and the signals of the bus ICBUS are left floating.

Each memory cell CMC0–CMC9 is further supplied with a memory cell program enable signal PGEN supplied by a respective ground/high-voltage switch CHVSW. Said switch CHVSW is controlled by an output signal of a respective three-input AND gate 6 which has a first input supplied with a column redundancy register program enable signal CRRPGE activated by a control circuitry (not shown because it is well known in the art) generally provided in the memory device, a second input supplied with a respective row address signal of the set of row address signals R5–R8 also taken from the row address bus RABUS, and a third input supplied with the sector selection signal SS. The AND gate 6 and the switch CHVSW represent a column redundancy register programming selection circuitry. The four column redundancy registers CRR associated with a given memory sector are each supplied by one different row address signal of the set R5–R8, to select one of them for programming.

Supposing that a defective bit line in a given memory sector portion of a given memory sector is found, to program one of the four column redundancy register CRR associated with such memory sector, the address of the defective bit line is supplied to the memory device and is carried by the column address signal bus CABUS. The memory, device is further supplied with a row address such that the row address signals R0–R3 carry the identifying code of the memory sector portion to which the defective bit line belongs. The sector selection signal SS of the memory sector to which the defective bit line belongs is further activated, and one of the four row address signals R5–R8 is also activated, to select one among the four column redundancy registers associated with the addressed sector. Finally, the internal control circuitry activates the signal CRRPGEN. In the selected column redundancy register CRR, the signal PGEN is driven to a high-voltage value, and the memory cells CMC0–CMC9 are therefore programmed according to the logic state of the respective signals CO,CONC5,C5N and R0,R0N–R3,R3N supplying them.

A row redundancy circuitry for a semiconductor memory, device with an architecture similar to that of FIG. 6 is described in the European Patent Application No. 94830062.9. filed Feb. 17, 1994, incorporated herein by reference. Also incorporated herein by reference are European Patent Applications Nos. 94830146.0, filed Mar. 29, 1994; 93/830,504.2, filed Dec. 15, 1993; 93/830,528.1, filed Dec. 29. 1993; and 93/830,491.2, filed Dec. 7, 1993.

Each half-matrix HM1,HM2 comprises an equal number, e.g., eight, of redundancy word lines.

Similar to the column redundancy circuitry just described, the row redundancy circuitry according to the present invention comprises a plurality of programmable non-volatile memory registers (row redundancy registers), but each row redundancy register is associated with a respective pair of redundancy word lines, for a total of eight row redundancy registers, four per half-matrix. The reason for such a difference resides in that it has been recognized that the most frequent defect affecting word lines consists in short-circuits between adjacent word lines (when the selection of one of two short-circuited word lines is attempted, the potential of the desired word line cannot rise to the designed value as the desired word line is linked by the short-circuit to the potential of the adjacent non-selected word line). Therefore, when a defective word line is found during testing, it is assumed that such word line is short-circuited with the adjacent word line (the one which, in the testing scanning sequence, follows the defective word line), and both said word lines must be replaced by two respective redundancy word lines. From then on, the two defective word lines will never be selected.

Since defective word lines always come in pairs, it is known to design the row redundancy registers in such a way as to store a pair of row addresses in each row redundancy register. In this manner, each row redundancy register is associated with a respective pair of redundancy word lines. Thus, the addresses of two adjacent short-circuited word lines can be programmed into each row redundancy register. In memory devices, the association between the word lines in the memory matrix and the respective selection signals generated by the row address signal decoding circuitry is generally such that adjacent word lines have addresses which only differ in one bit; since, however, such bit can be any one of the bits constituting the row address signal set it follows that in order to be always able to replace two adjacent short-circuited word lines, each row redundancy register should store two full row addresses. This means that each row redundancy register must comprise a number of memory cells equal to twice the number of row address bits. However, since the memory cells occupy a significant chip area, this would lead to an excessive increase in the overall chip size so that the overall process yield would be decreased instead of increased. This is why a compromise is generally reached between the repairability rate for defective word line pairs and an increase in chip size. In practice, designers give up the possibility of replacing two adjacent short-circuited word lines whatsoever, limiting such replacement to adjacent word lines whose addresses only differ in one or more bits belonging to a given subset of the whole row address signal set. Defining m as the number of bits in the row address signal set, it can be thought of as being the sum of two subsets n and q such that n contains the most significant row address bits, while q contains the least significant row address bits. When the replacement of defective word line pairs is limited to those adjacent word lines having addresses differing in one or more bits of the subset q, it is sufficient to store in a given row redundancy register the full row address m for only one of the pair of adjacent word lines, and the subset q for the other word line of the pair. In this way, each row redundancy register must be made up of (m+q) memory cells instead of 2m. The impact on the repairability rate can be appreciated by considering that the probability of having a short-circuit detect between two adjacent word lines with addresses differing in one or more bits in the subset n (a detect which cannot be repaired) is $\frac{1}{2}q$.

Figure 8:
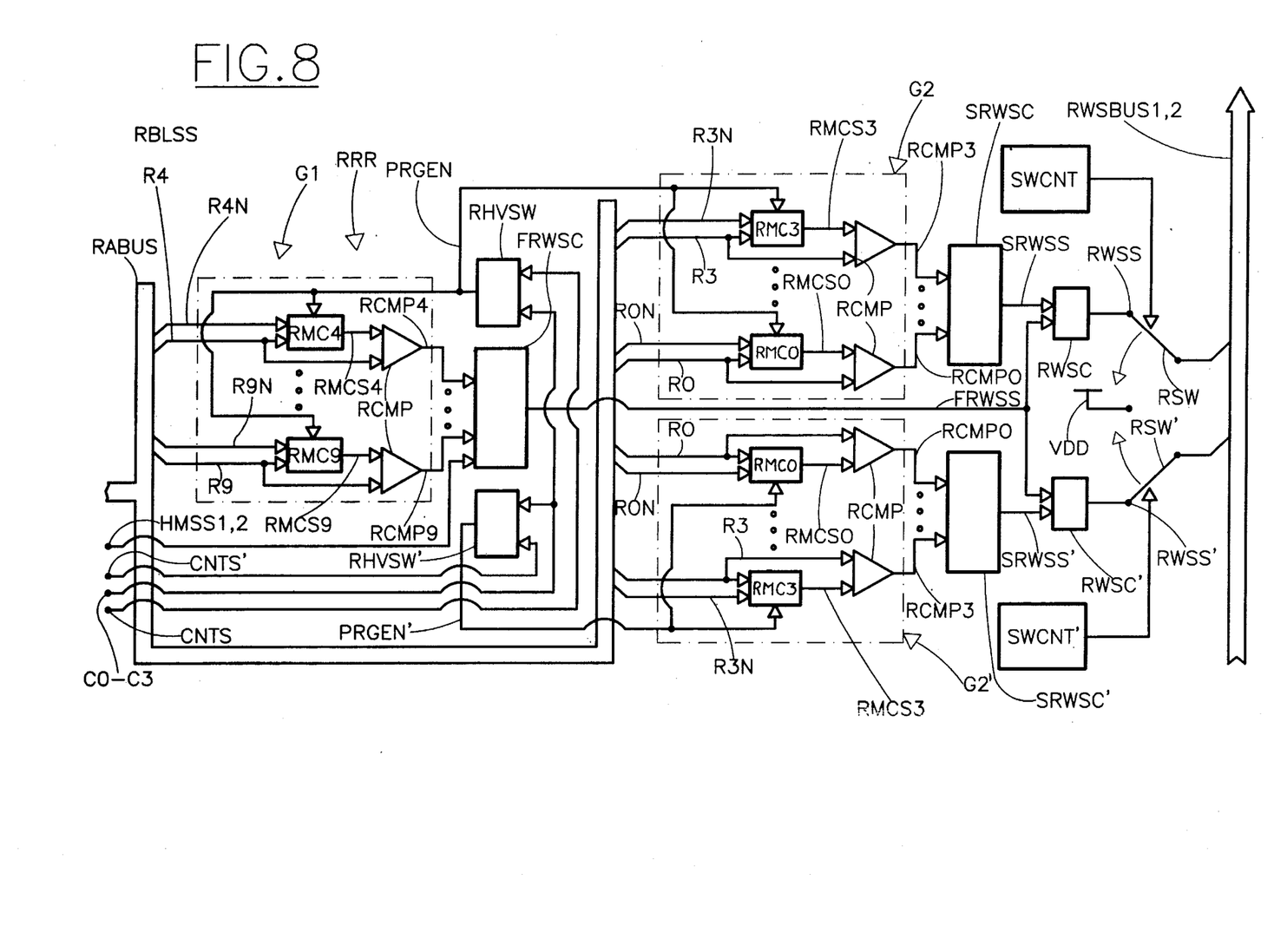
FIG. 8 is a schematic circuit diagram of a non-volatile memory register of the second plurality of the redundancy circuitry, for the selection of redundancy word lines.

Referring to the present example, as shown in FIG. 8, each row redundancy register RRR comprises a first group G1 of programmable non-volatile memory cells RMC4–RMC9 (six in the shown example) and two second groups G2 and G2' of programmable non-volatile memory cells RMC0–RMC3 (four in the example).

The memory cells RMC4–RMC9 of the first group G1 of each redundancy register RRR are each supplied with a respective row address signal R4–R9 and with the respective logic-complemented signal R4N–R9N. The twelve signals R4,R4N–R9,R9N are taken from the row address signal bus RABUS and correspond to the most significant row address bits. Each memory cell RMC4–RMC9 has an output signal RMCS4–RMCS9 representing the memory cells status which is supplied, together with the respective row address signal R4–R9, to a respective comparator RCMP, whose output signal RCMP4–RCMP9 is activated only when the memory cell status (represented by the signal RMCS4–RMCS9) coincides with the current state of the respective row address signal R4–R9. All the signals RCMP4–RCMP9 supply a first-level redundancy word line selection circuit FRWSC which is further supplied with a halt-matrix selection signal HMSS1 or HMSS2. Such signal allows the selection for reading or programming, of one of the two half-matrices HM1 ,HM2. The four row redundancy registers RRR associated with the same half matrix are commonly supplied with the signals HMSS1, while the remaining four row redundancy registers RRR, associated with the other halt-matrix, will be supplied with a signal HMSS2, which is the logic complement of the signal HMSS1 and which allows the selection of said other half matrix. When all the signals RCMP4–RCMP9 and the half-matrix selection signal HMSS1 or HMSS2 are activated (i.e.. when the current state of the most significant row address signals R4–R9 coincides with the logic state stored in the memory cells RMC4–RMC9 of the first group G1) the first-level redundancy word line selection circuit FRWSC activates a respective first-level redundancy word line selection signal FRWSS.

Each memory cell RMC0–RMC3 in the two second groups G2 and G2' is supplied with a respective row address signal R0–R3 and with the respective logic complemented signal RON–R3N. The eight signals R0,RON–R3,R3N are taken from the row address signal bus RABUS, and correspond to the least significant row address bits: similarly to the memory cells RMC4–RMC9 in the first group G1, each memory cell RMC0–RMC3 in the groups G2 and G2' having an output signal RMCS0–RMCS3 representing the memory cell status which is supplied, together with the respective row address signal R0–R3, to a respective comparator RCMP, whose output signal RCMP0–RCMP3 is activated only when the memory cell status, represented by the signal RMCS0–RMCS3, coincides with the current state of the respective row address signal R0–R3. Each one of the two groups of signals RCMP0–RCMP3 supplies a respective second-level redundancy word line selection circuit SRWSC and SRWSC' which, when all the signals RCMP0–RCMP3 of the respective group are activated (i.e., when the current state of the least significant row address signals R0–R3 coincides with the logic state stored in the memory cells RMC0–RMC3 of the respective second group G2 and G2'), activates a respective second-level redundancy word line selection signal SRWSS and SRWSS'. Each one of the two second-level selection signals SRWSS and SRWSS' is supplied, together with the first-level selection signal FRWSS, to a respective redundancy word line selection circuit RWSC and RWSC', whose output RWSS and RWSS' is activated when both the first-level selection signal FRWSS and the respective second-level selection signal SRWSS and SRWSS' are activated.

The signals RWSS and RWSS' are connected to two respective signals of a redundancy word line selection signal bus RWSBUS1 or RWSBUS2 through a respective switch RSW and RSW'. The switches RSW and RSW' are controlled by a respective control circuitry SWCNT and SWCNT', which can selectively commutate the switch RSW and RSW' from the respective redundancy word line selection signal RWSS,RWSS' to a fixed voltage supply line VDD. This is useful for performing particular in-factory device tests, e.g., for testing the absence of detects in the redundancy word lines, in this case, since such test is performed before the row redundancy registers are programmed, it is necessary to address the various redundancy word lines. Two buses RWSBUS1 and RWSBUS2 are provided, one supplying selection means (not shown) for the redundancy word lines of the first half-matrix HM1, and the other supplying selection means (also not shown) for the redundancy word lines of the second half matrix HM2. Each bus RWSBUS1 and RWSBUS contains eight signals.

The activation of the signal RWSS determines the selection of one of the pair of redundancy word lines associated with the row redundancy register RRR, while the activation of the signal RWSS' determines the selection of the other redundancy word line of said pair. Further, the activation of the signal RWSS or RWSS' prevents the defective word line whose address is stored in the memory cells of the first group G1 and of the second group G2 or G2' of memory cells of the row redundancy register from being selected.

Each memory, cell RMC4–RMC9 of the first group G1 and each memory cell RMC0–RMC3 of the second group G2 is further supplied with a first memory cell program enable signal PRGEN supplied by a first ground/high-voltage switch RHVSW, while each memory cell RMC0–RMC3 of the second group G2' is further supplied with a second memory cell program enable signal PRGEN' supplied by a second ground/high-voltage switch RHVSW'. The switch RHVSW is supplied with a first control signal CNTS and with a column address signal C0–C3 taken from the column address signal bus CABUS. The switch RHVSW' is also supplied with the column address signal C0–C3 and with a second control signal CNTS'.

Figure 9:
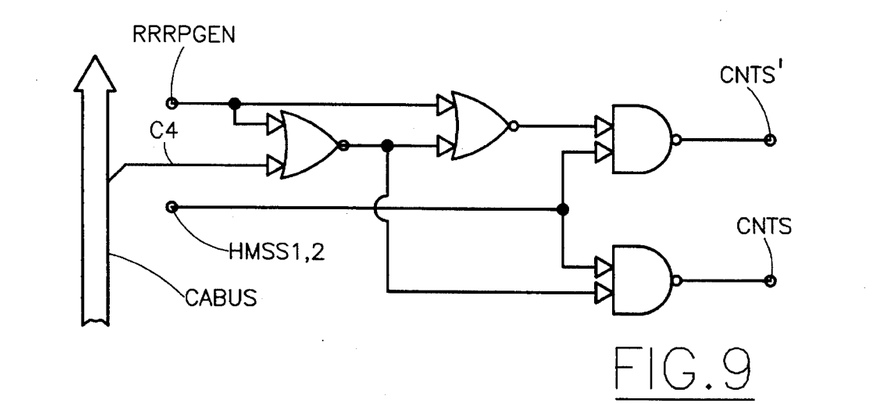
FIG. 9 is a schematic circuit diagram of a control circuitry for the programming of the non-volatile memory registers of the second plurality of the redundancy circuitry.

In FIG. 9 there is shown a circuit for the generation of the two control signals CNTS and CNTS'. Two of such circuits are provided, one for the row redundancy registers RRR associated with the half-matrix HM1 and one for the row redundancy registers RRR associated with the half-matrix HM2. The activation of the two control signal CNTS and CNTS' is mutually exclusive, i.e., they are never simultaneously activated; their activation is submitted to the activation of a row redundancy register program enable signal ILR.RPGEN by the internal control circuitry, and to the activation or the respective half-matrix selection signal HMSS1 or HMSS2. A column address signal C4 is used to selectively activate either the signal CNTS or CNTS'.

As previously noted, only those pairs of adjacent short-circuited word lines whose addresses differ in one or more bits belonging to their least significant part, represented by the row address signals R0–R3, can be replaced by redundancy word line pairs. In fact, each row redundancy register RRR comprises a unique group (the first group G1) of memory cells RMC4–RMC9, to store the most significant bits of the row address of a pair of word lines. Pairs of adjacent defective word lines with addresses differing in one or more bits belonging to their most significant part, represented by the row address signals R4–R9, cannot therefore be replaced by redundancy word line pairs. The impact on the repairability rate can be appreciated by considering that the probability of having a defect between two adjacent word lines with addresses differing in one or more bits in their most significant part is 1/16. Such a compromise allows limiting the number of memory cells required in each redundancy register to 6+4+4. It is obviously possible to increase the repairability rate by decreasing the number of memory cells in the common first group G1, and by increasing the number of memory cells in the two second groups G2 and G2', at the expense, however, of an increase in the overall number of memory cells, and thus in the chip size. If, for example, the first group G1 of memory cells is made to comprise five memory cells, and each one of the two second groups G2 and G2' five memory cells, the probability of having a nonrepairable defect is 1/32, but the number of memory cells required for each redundancy register increases of one unity (5+5+5).

Supposing that a pair of adjacent defective word lines is found in a given half-matrix, the addresses of the two word lines must be programmed into one of the four row redundancy registers RRR associated with said half-matrix. First, the address of one of the two defective word lines is supplied to the memory device, so that the row address signals R0–R3 carry, the least significant row address bits, and the row address signals R4–R9 carry the most significant row address bits. One of the four column address signals C0–C3 is activated, to select for programming one of the four row redundancy registers RRR associated with said half-matrix; also, the column address signal C4 is kept low, to enable the activation of the control signal CNTS. When the internal control circuitry drives the signal RRRPGEN low, the signal CNTS goes low, and the signal PRGEN is driven to the high-voltage value, so that the memory cells RMC0–RLMC3 of the group G2 and the memory cells RMC4–RMC9 of the first group G1 can be programmed. Second, the row address supplied to the memory device is changed so that the row address signals R0–R3 carry the least significant row address bits of the other word line of the pair; also, the column address signal C4 is driven high, to enable the activation of the control signal CNTS'. When the internal control circuitry drives the signal RRRPGEN low, the signal CNTS' is driven low, and the signal PRGEN' is driven to the high-voltage value; the memory cells RMC0–RMC3 of the group G2' are therefore programmed to store the least significant row address bits of the second word line of the pair.

Figure 10:
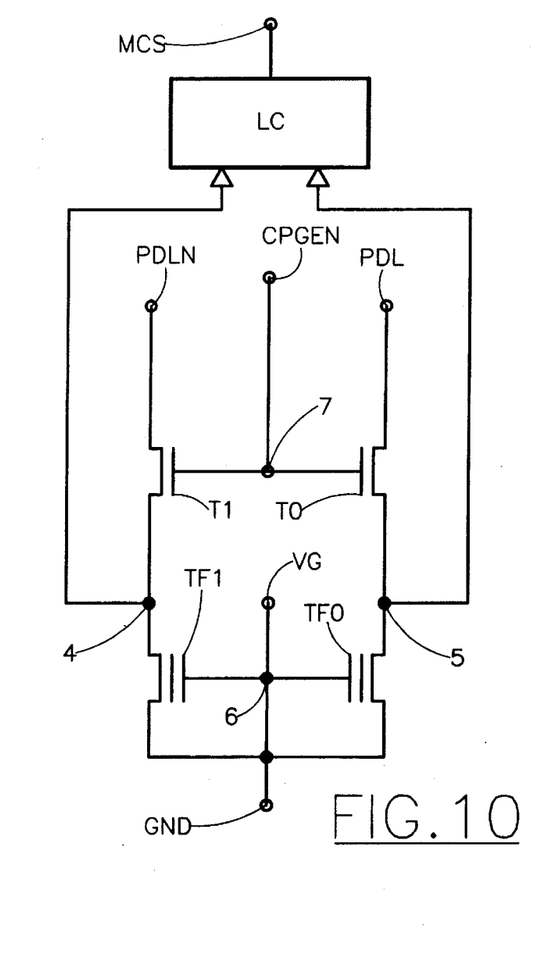
FIG. 10 is a schematic circuit diagram of a memory cell for the nonvolatile memory registers of FIGS. 7 and 8.

As described in the European Patent Application No. 93830474.8, filed Nov. 30, 1993, incorporated herein by reference, and as shown in FIG. 10, each programmable non-volatile memory cell CMC0–CMC9 and RMC0–RMC9 comprises a pair of programmable non-volatile memory elements, for example two stacked-gate MOSFETs TF0 and TF1 with source connected to a ground voltage GND and control gate connected to a supply voltage VG which can be switched by the internal control circuitry from a reading voltage value (typically of 5 V) to a programming high-voltage value (of about 12 V). The drains of TF0 and TF1 are connected to a reading load circuit LC whose output represents a memory cell status signal MCS; the drains of TF0 and TF1 are also connected to a programming load circuit substantially represented by two MOSFETs T0 and T1 whose drains are respectively connected to one of a pair of logic-complemented programming data lines PDL and PDLN. The gates of the MOSFETs T0 and T1 are commonly connected to a cell program enable signal CPGEN. In each column redundancy register CRR, the programming data lines PDL and PDLN of each one of the memory cells CMC0–CMC5 of the block 1 are respectively connected to a respective pair of logic-complemented column address signals C0,CON–C5,C5N, while the programming data lines PDL and PDLN of each one of the memory cells CMC6–CMC9 of the block 2 are respectively connected to a respective pair of logic-complemented row address signals R0,RON–R3,R3N. The cell program enable signal CPGEN of all the memory cells CMC0–CMC9 is connected to the signal PGEN. In each row redundancy register RRR, the programming data lines PDL and PDLN of the memory cells RMC0–RMC9 are respectively connected to a respective pair of logic-complemented row address signals R0,RON–R9,R9N. The cell program enable signal CPGEN of the memory cells RMC4–RMC9 of the first group G1 and of the memory cells RMC0–RMC3 of the second group G2 is connected to the first memory cell program enable signal PRGEN, while the cell program enable signal CPGEN of the memory cells RMC0–RMC3 of the second group G2' is connected to the second memory cell program enable signal PRGEN'.

The redundancy circuitry previously described from the circuit point of view will be now described from the physical layout point of view.

Figure 1:
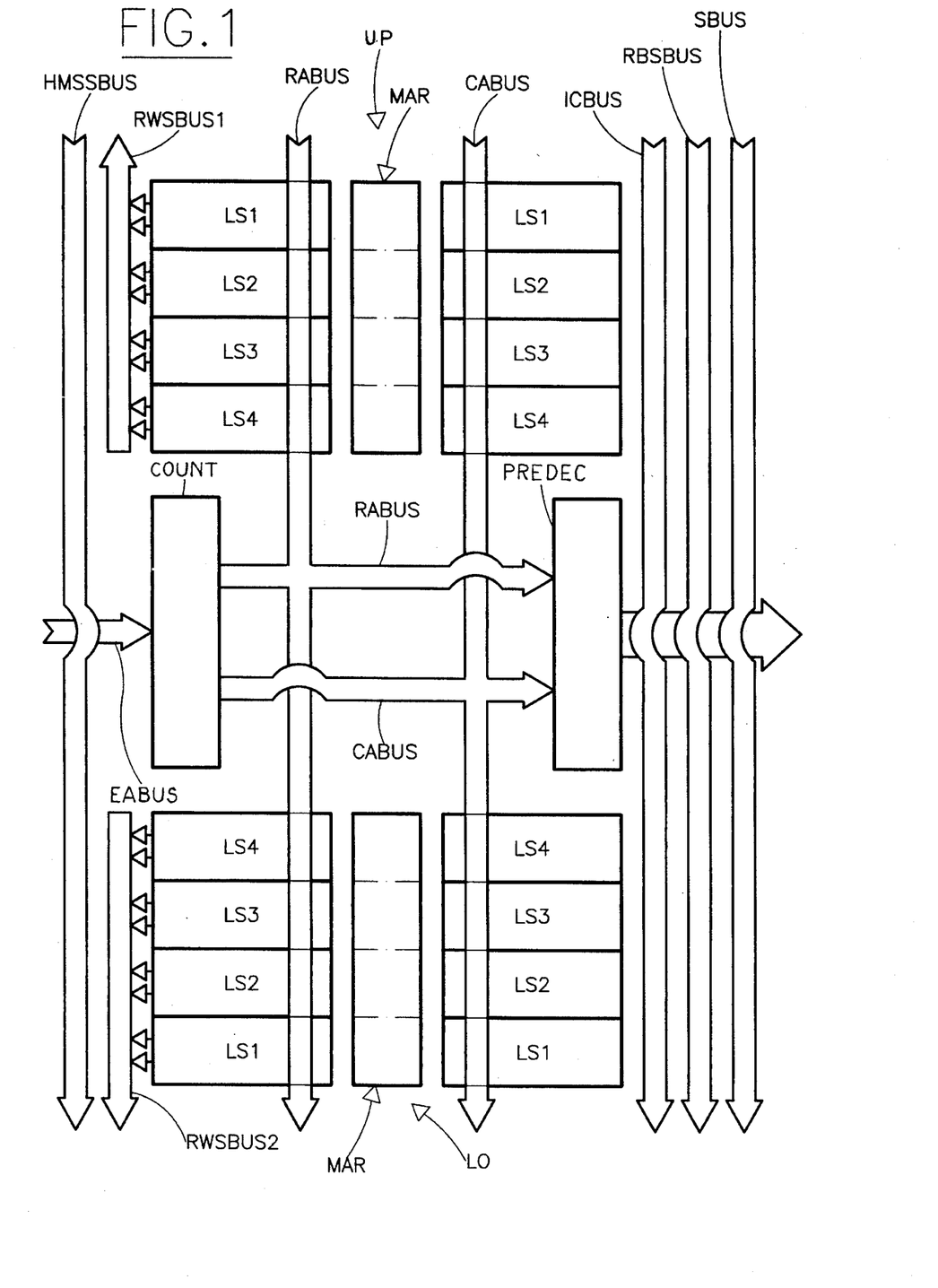
FIG. 1 is a simplified view of a redundancy circuitry layout according to the present invention.

As shown in FIG. 1, the redundancy circuitry physical layout is shown in block form, comprising an upper portion UP and in a lower portion LO. The chip area between said upper and lower portions UP and LO is dedicated to the integration of other circuit blocks of the memory device. In the present example, referring to a Flash EEPROM device, said circuit blocks are represented by a counter COUNT, which is supplied by an external address signal bus EABUS containing signals generated by the address input buffer circuits (per-se known and therefore not shown), and by a predecoding circuitry PREDEC, performing a preliminary decoding of the row address signals RABUS and of the column address signals CABUS supplied by the counter COUNT. In a Flash EEPROM device the counter COUNT is necessary to automatize the preprogramming operation, which is the preliminary programming step to which all the memory elements of a given memory sector are submitted before they are erased. In this phase, the counter COUNT generates internally to the chip the address signals necessary to sequentially select the memory elements which are to be preprogrammed. During normal reading or programming operations, the counter COUNT is instead transparent, which means that the row address signal bus RABUS and the column address signal bus CABUS are directly connected to the external address signal bus EABUS.

The physical disposition of circuit blocks shown in FIG. 1 is particularly effective in reducing the overall chip size, since all the circuit blocks which must be supplied with the address signals are placed in the same chip region, thus eliminating the necessity of providing long interconnection lines running along the chip.

The upper and lower portions UP and LO of the redundancy circuitry layout each comprise a central array of memory elements MAR wherein the programmable non-volatile memory elements (i.e., the stacked gate MOSFETs TF0 and TF1) of the memory cells CMC0–CMC9 and RMC0–RMC9 of the column and row redundancy registers CRR and RRR previously described are located, and four identical layout strips LS1–LS4, each strip being parted in two parts by the central array of memory elements MAR. The column address signal bus CABUS and the row address signals bus RABUS run parallel to each other at opposite sides of the central array of memory elements MAR.

Figure 2:
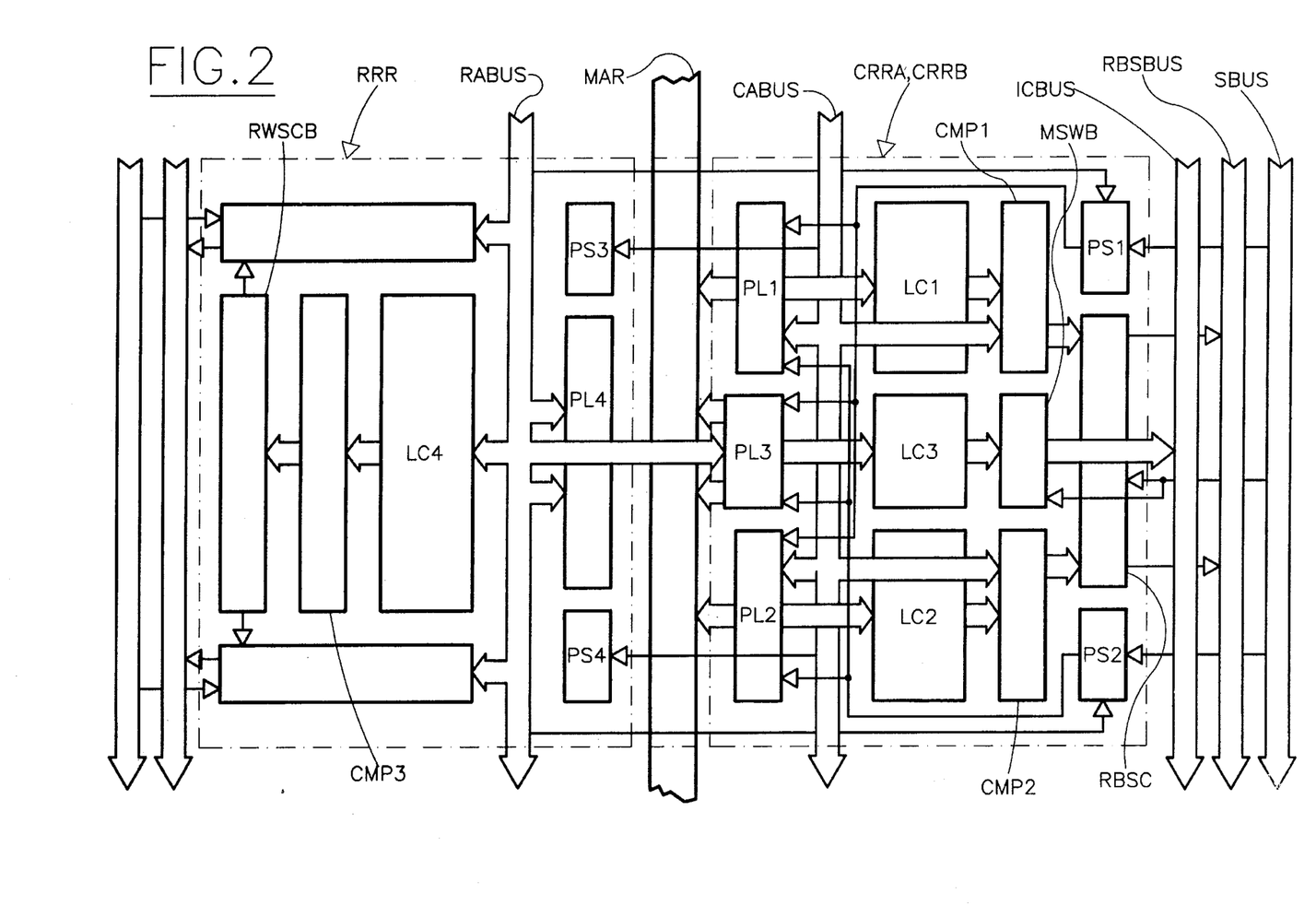
FIG. 2 is a schematic view of one strip of the layout of FIG. 1.

The structure of each layout strip LS1–LS4 is shown in expanded view in FIG. 2; each layout strip LS1–LS4 is split in two sides, located at opposite sides with respect to the central array of memory elements MAR. Each layout strip LS1–LS4 represents the chip area wherein two column redundancy registers CRR and one row redundancy register RRR are obtained; more precisely, the side of each layout strip on the right of the central array of memory elements MAR represents the chip area dedicated to the integration of two column redundancy registers CRRA and CRRB, while the side of each layout strip LS1–LS4 on the left of the central array of the memory elements MAR represents the chip area dedicated to the integration of one row redundancy register RRR. The four layout strips LS1–LS4 in the upper portion UP of the redundancy layout contain the four row redundancy registers RRR associated with the half-matrix HM1, while the four layout strips LS1–LS4 in the lower portion LO of the redundancy layout contain the four row redundancy registers RRR associated with the half-matrix HM2.

Figure 4:
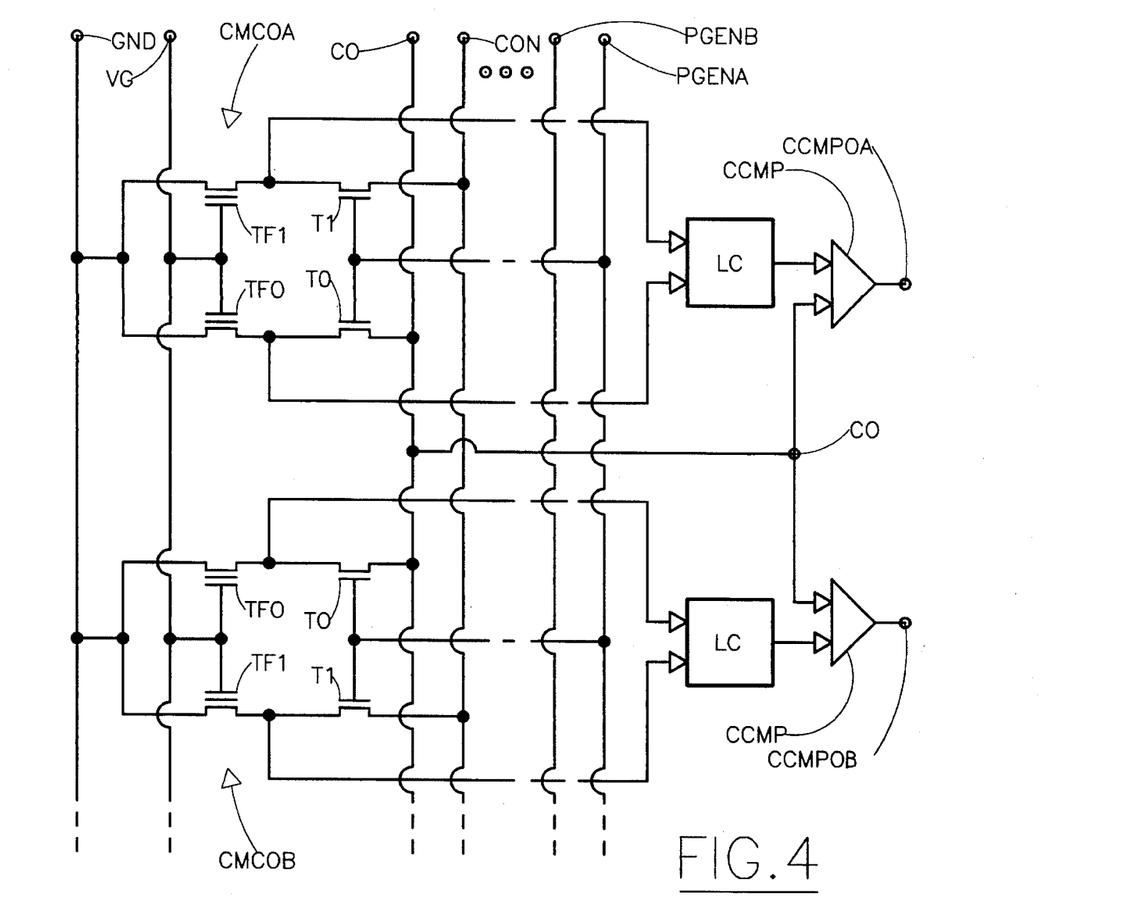
FIG. 4 is a schematic view of two interlaced memory cells.

The right side of each layout strip LS1–LS4 is designed so that the two column redundancy registers CRRA and CRRB are partially interlaced one to another: in other words, a given memory cell CMC0–CMCS, associated with a given column address signal C0–C5 of one of the two column redundancy registers CRRA, is not physically adjacent to another memory cell of the same column redundancy register associated with another column address signal, but to that memory cell of the other column redundancy register CRRB which is associated with the same column address signal. In FIG. 4, schematically showing two interlaced memory cells of the two column redundancy registers CRRA and CRRB, CMCOA is the memory cell of the column redundancy register CRRA associated with the column address signal C0, and CMCOB is a memory cell of the other column redundancy register CRRB also associated with the column address signal CO. Such a technique allows a reduction in area, since it reduces the number of address signal lines that must be traced from the column address signal bus CABUS to the layout blocks that will be described in the following.

Figure 3:
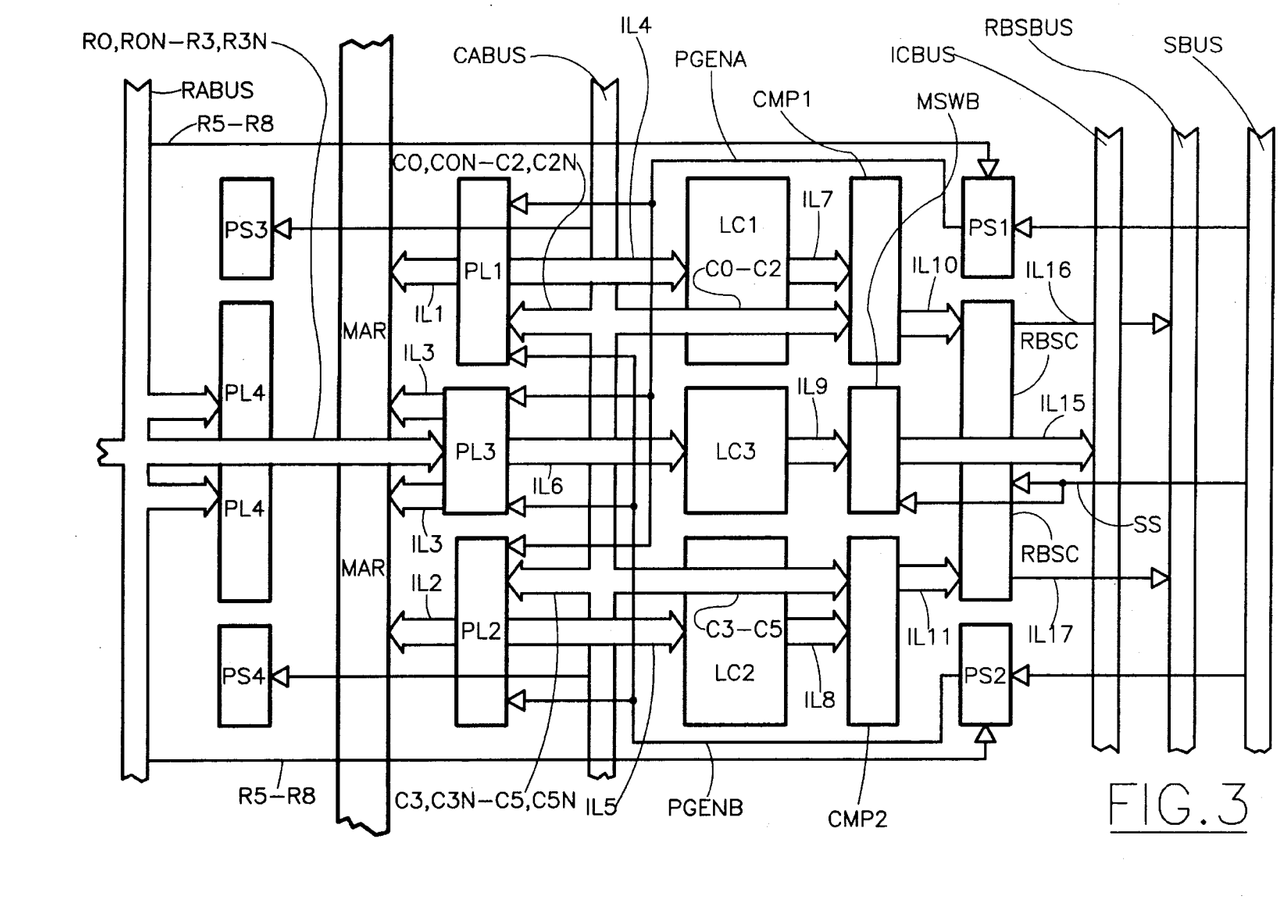
FIG. 3 is an expanded view of one side of the layout strip of FIG. 2.

FIG. 3 is an expanded view of the right side of a given layout strip LS1–LS4. Just beside the central array of memory elements MAR and the column address signal bus CABUS, three layout blocks are provided: an upper block PL1 containing the programming load circuits for the interlaced memory cells CMC0–CMC2, a lower block PL2 containing the programming load circuits for the interlaced memory cells CMC3–CMC5, and a central block PL3 containing the programming load circuits for the memory cells CMC6–CMC9 of the two column redundancy registers CRRA and CRRB. As previously described, each programming load circuit in PL1 and PL2 comprises a pair of MOSFETs T0,T1 with source connected to the drain of a respective stacked-gate transistors TF0,TF1 in the array of memory, elements MAR and drain connected to a respective column address signal line C0,CON–C5,C5N. Column address signal lines C0,CON–C2,C2N and C3,C3N–C5, C5N are therefore provided to connect respective signal lines in the column address bus CABUS to the programming load circuits in the upper and lower blocks PL1 and PL2, respectively. Similarly, each programming load circuit in PL3 comprises a pair of MOSFETs T0,T1 with source connected to the drains of respective stacked-gate transistors TF0,TF1 in MAR and drain connected to a respective row address signal line R0,R0N–R3,R3N. Row address signal lines R0,R0N–R3,R3N are therefore provided to connect respective signal lines in the row address signal bus RABUS to the programming load circuits in the central block PL3. Interconnection lines IL1, IL2 and IL3 are further provided between the three blocks PL1, PL2, PL3 and the central array of memory elements MAR, to connect the drains of the stacked gate transistors TF0,TF1 to the respective programming load circuit T0,T1.

On the right of the column address signal bus CABUS, three layout blocks are provided: an upper block LC1 containing the load circuits LC of the interlaced memory cells CMC0–CMC2, a lower block LC2 containing the load circuits LC of the interlaced memory cells CMC3–CMC5, and a central block LC3 containing the load circuits LC of the memory cells CMC6–CMC9 of the two column redundancy registers CRRA and CRRB. The blocks LC1, LC2 and LC3 are respectively connected to the blocks PL1, PL2 and PL3 by means of respective interconnection lines IL4, IL5 and IL6. In LC1 and LC2 the load circuits LC are interlaced (FIG. 4), which means that the load circuit LC of the memory cell CMCOA of CRRA is adjacent to the load circuit LC of the memory cell CMCOB of CRRB, and so on.

On the fight of the blocks LC1 and LC2, two blocks CMP1 and CMP2 respectively contain the comparators CCMP for the interlaced memory cells CMC0–CMC2 and CMC3–CMC5. Again, the comparators CCMP are interlaced, which means that the comparator CCMP associated with the memory cell CMCOA of CRRA is adjacent to the comparator CCMP associated with the memory cell CMCOB of CRRB, and so on (FIG. 4). Amidst the blocks CMP1 and CMP2, a central block MSWB contains instead the two multiple switches MSW of the two column redundancy registers CRRA and CRRB. Interconnection lines IL7 and IL8 representing respectively the memory cell status signals CMCS0–CMCS2 and CMCS3–CMCS5 are provided to interconnect the blocks LC1 and LC2 to the blocks CMP1 and CMP2, respectively. Column address signal lines C0–C2 and C3–C5 are also provided to respectively connect respective signal lines in the column address signal bus CABUS to the comparators CCMP in the blocks CMP1 and CMP2. Interconnection line IL9, representing the two local buses ICBUS', of the two column redundancy registers CRRA and CRRB, are wired from the block LC3 to the block MSWB. Further, interconnection lines IL15 are provided to connect the output channel of the multiple switches MSW in the block MSWB to respective signal lines in the bus ICBUS that runs on the right side of the upper and lower portions UP trod LO of the redundancy layout.

Finally, on the fight of the blocks CMP1, MSWB and CMP2, a central block RBSC contains the two redundancy bit line selection circuits RBLSC and the two switches SW of the two column redundancy registers CRRA and CRRB. An upper block PS1 contains the programming selection circuitry (i.e., the AND gate 6 and the ground/high-voltage switch CHVSW in FIG. 7) for one of the two column redundancy registers, e.g., CRRA, while a lower block PS2 contains the programming selection circuitry for the other column redundancy register, CRRB. Interconnection lines IL10 and IL11, representing respectively the output signals CCMP0–CCMP2 and CCMP3–CCMP5 of the comparators CCMP in the blocks CMP1 and CMP2, are provided to respectively interconnect the blocks CMP1 and CMP2 and the block RBSC. A sector selection signal line SS is further provided to supply a respective signal in the sector selection signal bus SBUS to the block RBSC and to the block MSWB. A signal line R5–R8 is provided to supply a row address signal of the set R5–R8 in the row address signal bus RABUS to the block PS1; another signal line R5–R8 is provided to supply another row address signal of the set R5–R8 in the row address signal bus RABUS to the block PS2. Two interconnection lines, representing the program enable signals PGENA and PGENB for the column redundancy registers CRRA and CRRB, are respectively provided to connect the blocks PS1 and PS2 to both the blocks PL1, PL2 and PL3, wherein they are connected to the gates of the MOSFETs T0,T1 of the programming load circuits.

Two interconnection lines IL16 and IL17 are provided to connect the two switches SW in RBSC to two respective signal lines of the bus RBSBUS, which runs parallel to the bus ICBUS.

The side of each layout strip LS1–LS4 on the left of the central array of memory elements MAR represents the chip area wherein one row redundancy register RRR is obtained.

Figure 5:
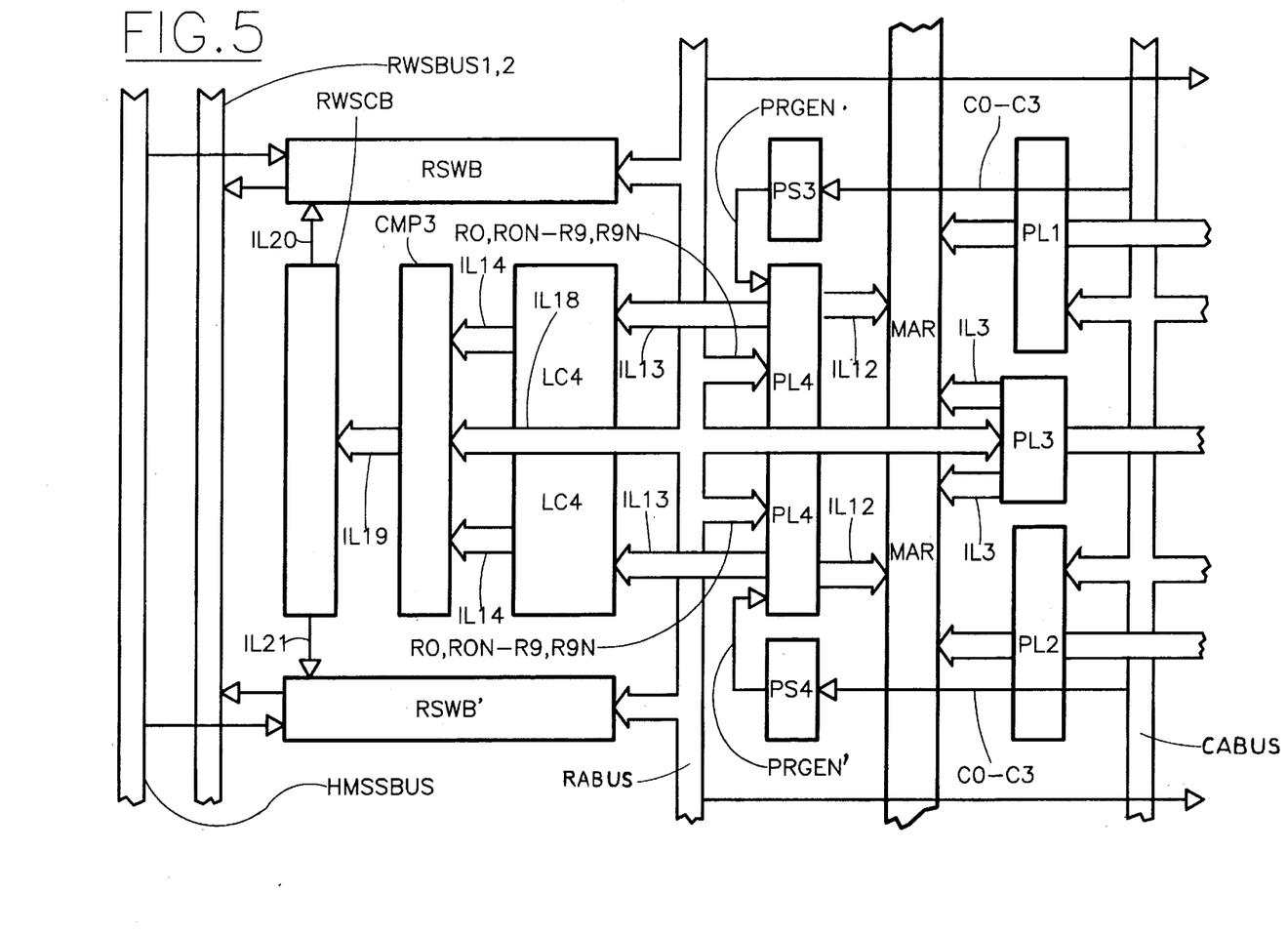
FIG. 5 is an expanded view of another side of the layout strip of FIG. 2.

FIG. 5 is an expanded view of the left side of a given layout strip LS1–LS4. Just beside the central array of memory elements MAR there are provided three layout blocks PL4, PS3 and PS4. Block PL4 is located in central position, and contains the programming load circuits for the memory elements TF0,TF1 of the memory cells RMC0–RMC9 of the row redundancy register RRR. As previously described, the programming load circuits are represented by pairs of MOSFETs T0,T1 with source connected to the drain of respective stacked-gate MOSFETs TF0,TF1 in MAR and with drain connected to a respective row address signal line R0,R0N–R9.R9N; interconnection lines IL12 are therefore provided to connect the MOSFETs TF0.T1 in the block PL4 to the stacked-gate MOSFETs TF0,TF1 in the central array of memory elements MAR, and row address signal lines R0,R0N–R9,R9N are provided to connect respective signal lines in the row address signal bus RABUS to the MOSFETs T0.T1 in the block PL4. The blocks PS3 and PS4 respectively represent the high-voltage switches RHVSW and RHVSW' of FIG. 8. Two interconnection lines C0–C3 are also provided to supply the switches RHVSW and RHVSW' in the blocks PS3 and PS4 with a same column address signal of the set C0–C3 in the column address signal bus CABUS. Furthermore, two interconnection lines, respectively representing the signals PRGEN and PRGEN' of FIG. 8, are provided to connect the blocks PS3 and PS4 to the block PL4.

On the right of the row address bus RABUS there is provided a block LC4 which contains the load circuits LC of the memory cells RMC0–RMC9 of the row redundancy register RRR. Interconnection lines IL 13 are provided to connect the block PL4 to the block LC4. On the right of the block LC4 there is provided a layout block CMP3 containing the comparators RCMP of the row redundancy register RRR, and, on the right of the block CMP3, a layout block RWSCB containing the first- and second-level redundancy word-line selection circuits FRWSC, RWSC and RWSC' of FIG. 8. Interconnection lines IL14, representing the memory cell status signals RMCS0–RMCS9 of FIG. 8, are provided to connect the block LC4 to the block CMP3. Interconnection lines IL19, representing the signals RCMP0–RCMP9 of FIG. 8, are provided to connect the block CMP3 to the block RWSCB.

The comparators RCMP in CMP3 are also connected to respective row address signal lines R0–R9 of the row address signal bus RABUS by means of interconnection lines IL18.

Above and below the blocks LC4, CMP3 and RWSCB there are provided two layout blocks RSWB and RSWB', respectively containing the switch RSW and its control circuit SWCNT, and the switch RSW' and its control circuit SWCNT' (FIG. 8). Two interconnection lines IL20 and IL21, representing the redundancy word line selection signals RWSS and RWSS' in FIG. 8, are provided between the block RWSCB and the blocks RSWB and RSWB', respectively.

The switches RSW and RSW' in the blocks RSWB and RSWB' are respectively connected to a respective signal line of the bus RWSBUS1 (for the upper portion UP) or RWSBUS2 (for the lower portion LO).

The blocks RSWB and RSWB' are respectively connected to the row address signal bus RABUS by interconnection lines IL22 and IL23, and to a half-matrix selection signal bus HMSSBUS by two respective interconnection lines IL24 and IL25 representing either the half-matrix selection signal HMSS1 or HMSS2.

The layout according to the present invention, as shown in FIGS. 1 and 2 makes the exchange of signals between the row and column address signal buses and the circuit blocks constituting the redundancy circuitry easy, in particular between the row address signal bus RABUS and the column redundancy registers on the right side or each layout strip, and between the column address signal bus CABUS and the row redundancy registers on the left side of each layout strip.

The detailed discussion provided above describes preferred embodiments of the present invention. This discussion will enable those skilled in the art to make various modifications to these embodiments that do not depart from the spirit and the scope of the present invention. Accordingly, the present invention contemplates all such modifications that read on the appended claims and equivalents thereof.

We claim:

1. Redundancy circuitry layout for a semiconductor memory device, the redundancy circuitry comprising a first plurality of programmable non-volatile memory registers for the selection of redundancy bit lines of redundancy memory elements and a second plurality of programmable non-volatile memory registers for the selection of redundancy word lines of redundancy memory elements, wherein the redundancy circuitry layout comprises an array of programmable non-volatile memory elements for storing the addresses of defective bit lines and word lines which must be functionally replaced respectively by redundancy bit lines and word lines, and in the first and second plurality of programmable non-volatile memory registers are divided into layout strips which are perpendicular to said array of memory elements and which comprise each a first and a second strip sides located at opposite sides of the array of memory elements, the first strip side containing at least one memory register of the first plurality and being crossed by a column address signal bus running parallel to the array of memory elements, the second strip side containing one memory register of the second plurality and being crossed by a row address signal bus running parallel to the array of memory elements.

2. Redundancy circuitry layout according to claim 1, each memory register of the first plurality comprises memory cells supplied with respective column address signals, comparator means for comparing said column address signals with output signals of the memory cells, selection means supplied with output signals of the comparator means for selecting one respective redundancy bit line, each memory cell comprising at least one programmable non-volatile memory element, a load circuit for reading the information stored in said memory element, and a programming load circuit for electrically connecting the nonvolatile memory element to the respective column address signal, wherein each first strip side comprises a first region adjacent to the array of memory elements wherein the programming load circuits of the memory cells of said at least one memory register are obtained, a second region wherein the load circuits of the memory cells of said at least one memory register are obtained, the column address signal bus being interposed between said first region and said second region, a third region adjacent to the second region wherein the comparator means of said at least one memory register are obtained, and a fourth region adjacent to the third region wherein said selection means of said at least one memory register are obtained.

3. Redundancy circuitry layout according to claim 1, wherein each memory register of the second plurality comprises memory cells supplied with respective row address signals, comparator means for comparing said row address signals with output signals of the memory cells, selection means supplied with output signals of the comparator means for selecting at least one respective redundancy word line, each memory cell comprising at least one programmable non-volatile memory element, a load circuit for reading the information stored in said memory element, and a programming load circuit for electrically connecting the non-volatile memory element to the respective row address signal, wherein each second strip side comprises a first region adjacent to the array of memory elements wherein the programming load circuits of the memory cells of said one memory register are obtained, a second region wherein the load circuits of the memory cells of said one memory register are obtained, the row address signal bus being interposed between said first region and said second region, a third region adjacent to the second region wherein the comparator means of said one memory register are obtained, and a fourth region adjacent to the third region wherein said selection means of said one memory register are obtained.

4. Redundancy circuitry layout according to claim 2, wherein the first strip side contains two memory registers of the first plurality, each one associated with a respective redundancy bit line, the first region of the first strip side containing the programming load circuits of the memory cells of both the two memory registers, the second region of the first strip side containing the load circuits of the memory cells of both the two memory registers, the third region and the fourth region of the first strip side containing respectively the comparator means and the selection means of both the memory registers.

5. Redundancy circuitry layout according to claim 4, wherein the memory cells of one of the two memory registers are physically interlaced with the memory cells of the other of the two memory registers in such a way that pairs of memory cells of the two memory registers supplied by identical column address signals are physically adjacent one to another.

6. Redundancy circuitry layout according to claim 1, wherein it is further divided in two sides, each of said side comprising a central array of memory, elements and being divided in layout strips perpendicular to the respective central array of memory elements, the two sides being separated by circuit blocks of the memory device which are also supplied by the column address signals and by the row address signals.

7. A redundancy circuitry layout for a semiconductor device, the redundancy circuitry layout comprising:
a first layout strip side comprising a redundancy row register;
a row address bus that extends through the first layout strip side;
a second layout strip side comprising a redundancy column register;
a column address bus that extends though the second layout strip side; and
an array of memory elements, the array of memory elements being positioned between the first and the second layout strip sides.

8. The redundancy circuitry layout of claim 7 wherein the redundancy row register comprises a plurality of programming load circuits, each programming load circuit being coupled to the array of memory elements and to the row address bus, the first layout strip side further comprising:
a programming load circuit layout block containing the plurality of programming load circuits, the programming load circuit layout block being positioned between, and coupled to, the array of memory elements and the row address bus.

9. The redundancy circuitry layout of claim 8 wherein the redundancy row register further comprises a plurality of load circuits, each of the plurality of load circuits being coupled to a respective programming load circuit, the respective programming load circuit being from among the plurality of programming load circuits, the first layout strip side further comprising:
a load circuit layout block containing the plurality of load circuits, the load circuit layout block being positioned in close proximity with, and being coupled to, the programming load circuit layout block.

10. The redundancy circuitry layout of claim 9 wherein the redundancy row register further comprises a plurality of comparator circuits, each of the plurality of comparator circuits being coupled to a respective load circuit and a respective row address signal, the respective load circuit being from among the plurality of load circuits and the respective row address signal being from the row address bus, the first layout strip side further comprising:
a comparator circuit layout block containing the plurality of comparator circuits, the comparator circuit layout block being positioned in dose proximity with, and being coupled to, the load circuit layout block.

11. The redundancy circuitry layout of claim 8 wherein the redundancy row register further comprises a switch having an input coupled to a column address signal of the column address bus and a program enable output coupled to each of the programming load circuits.

12. The redundancy circuitry layout of claim 7 wherein the row address bus is substantially perpendicular to the first layout strip side.

13. The redundancy circuitry layout of claim 12 wherein the column address bus is substantially perpendicular to the second layout strip side.

14. The redundancy circuitry layout of claim 7 wherein the column address bus is substantially perpendicular to the second layout strip side.

15. The redundancy circuitry layout of claim 7 wherein the redundancy column register comprises a plurality of programming load circuits, each programming load circuit being coupled to the array of memory elements and to the column address bus, the second layout strip side further comprising:
a programming load circuit layout block containing the plurality of programming load circuits, the programming load circuit layout block being positioned between, and coupled to, the array of memory elements and the column address bus.

16. The redundancy circuitry layout of claim 15 wherein the redundancy column register further comprises a plurality of load circuits, each of the plurality of load circuits being coupled to a respective programming load circuit, the respective programming load circuit being from among the plurality of programming load circuits, the second layout strip side further comprising:
a load circuit layout block containing the plurality of load circuits, the load circuit layout block being positioned adjacent to the column address bus and being coupled to the programming load circuit layout block.

17. The redundancy circuitry layout of claim 16 wherein the redundancy row register further comprises a plurality of comparator circuits, each of the plurality of comparator circuits being coupled to a respective load circuit and a respective column address signal, the respective load circuit being from among the plurality of load circuits, and the respective column address signal being from the column address bus, the second layout strip side further comprising:

a comparator circuit layout block containing the plurality of comparator circuits, the comparator circuit layout block being positioned in close proximity with, and being coupled to, the load circuit layout block.

18. The redundancy circuitry layout of claim 15 wherein the redundancy column register further comprises a program selection circuit having an input coupled to a row address signal of the row address bus and having a program enable output coupled to each of the programming load circuits.

19. The redundancy circuitry layout of claim 7 wherein the array of memory elements, the row address bus and the column address bus are substantially in parallel with each other.

* * * * *

UNITED STATES PATENT AND TRADEMARK OFFICE
CERTIFICATE OF CORRECTION

PATENT NO.    :    5,559,743
DATED         :    September 24, 1996
INVENTOR(S)   :    Luigi Pascucci et al.

It is certified that error appears in the above identified patent and that said Letters Patent is hereby corrected as shown below:

In column 14, claim 1, line 29, following "circuitry" please insert --layout--.

In column 14, claim 1, line 39, following "in" please insert --that--.

In column 15, claim 6, line 49, please delete ",".

Signed and Sealed this

Twenty-fifth Day of March, 1997

*Attest:*

BRUCE LEHMAN

*Attesting Officer*    Commissioner of Patents and Trademarks